(12) United States Patent  
Brusberg et al.

(10) Patent No.: US 12,326,604 B2  
(45) Date of Patent: *Jun. 10, 2025

(54) INTEGRATED CIRCUIT PACKAGES HAVING ELECTRICAL AND OPTICAL CONNECTIVITY AND METHODS OF MAKING THE SAME

(71) Applicant: CORNING INCORPORATED, Corning, NY (US)

(72) Inventors: Lars Martin Otfried Brusberg, Corning, NY (US); Jin Su Kim, Seoul (KR); Aramais Robert Zakharian, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/736,771

(22) Filed: Jun. 7, 2024

(65) Prior Publication Data

US 2024/0319458 A1    Sep. 26, 2024

Related U.S. Application Data

(63) Continuation of application No. 17/044,707, filed as application No. PCT/US2019/025515 on Apr. 3, 2019, now Pat. No. 12,032,216.

(Continued)

(51) Int. Cl.
*G02B 6/42* (2006.01)
*C03C 3/04* (2006.01)
(Continued)

(52) U.S. Cl.
CPC .............. *G02B 6/4281* (2013.01); *C03C 3/04* (2013.01); *H05K 1/0274* (2013.01); *H05K 1/0306* (2013.01); *H05K 3/0011* (2013.01)

(58) Field of Classification Search
CPC .......... G02B 6/42; G02B 6/4281; C03C 3/04; H05K 1/0274; H05K 1/0306; H05K 3/0011

See application file for complete search history.

(56) References Cited

U.S. PATENT DOCUMENTS

| 4,130,680 A | 12/1978 | Ference et al. |
| 5,196,041 A | 3/1993 | Tumminelli et al. |

(Continued)

FOREIGN PATENT DOCUMENTS

| CN | 104867909 A | 8/2015 |
| CN | 104900780 A | 9/2015 |

(Continued)

OTHER PUBLICATIONS

Buch et al; "Design and Demonstration of Highly Miniaturized, Low Cost Panel Level Glass Package for MEMS Sensors".

(Continued)

*Primary Examiner* — Tina Wong
(74) *Attorney, Agent, or Firm* — Kevin M. Able

(57) ABSTRACT

Integrated circuit packages having electrical and optical connectivity and methods of making the same are disclosed herein. According to one embodiment, an integrated circuit package includes a glass substrate, an optical channel, and redistribution layers. The integrated circuit package further includes an integrated circuit chip positioned on the glass substrate and in optical communication with the optical channel and in electrical continuity with the redistribution layers.

22 Claims, 7 Drawing Sheets

Related U.S. Application Data

(60) Provisional application No. 62/652,252, filed on Apr. 3, 2018.

(51) Int. Cl.
  *H05K 1/02* (2006.01)
  *H05K 1/03* (2006.01)
  *H05K 3/00* (2006.01)

(56) References Cited

U.S. PATENT DOCUMENTS

| | | |
|---|---|---|
| 9,340,451 B2 | 5/2016 | Boek et al. |
| 9,798,087 B1 | 10/2017 | Mathai et al. |
| 10,032,216 B2 * | 7/2018 | Binion .................. G06Q 30/08 |
| 2003/0024274 A1 | 2/2003 | Cho et al. |
| 2004/0017977 A1 | 1/2004 | Tong et al. |
| 2013/0330044 A1 | 12/2013 | Wu |
| 2015/0021081 A1 | 1/2015 | Mitarai et al. |
| 2015/0277047 A1 | 10/2015 | Flemming et al. |
| 2015/0331204 A1 | 11/2015 | Razdan et al. |
| 2016/0054530 A1 | 2/2016 | Feng et al. |
| 2017/0052317 A1 | 2/2017 | Mahgerefteh et al. |
| 2017/0073266 A1 | 3/2017 | Amosov et al. |
| 2017/0363823 A1 | 12/2017 | Mentovich et al. |
| 2020/0235020 A1 | 7/2020 | Dohn et al. |

FOREIGN PATENT DOCUMENTS

| | | |
|---|---|---|
| EP | 1597636 A1 | 11/2005 |
| GB | 2315266 A | 1/1998 |
| JP | 2000-178036 A | 6/2000 |
| JP | 2005-075706 A | 3/2005 |
| WO | 2005/064421 A1 | 7/2005 |
| WO | 2006/047896 A1 | 5/2006 |
| WO | 2014/043267 A1 | 3/2014 |
| WO | 2017/009468 A1 | 1/2017 |
| WO | 2018/098146 A1 | 5/2018 |

OTHER PUBLICATIONS

Chinese Patent Application No. 201980037557.3, Office Action, dated May 11, 2022, 14 pages (7 pages of English Translation and 7 pages of Original Document), Chinese Patent Office.

Dangel et al., Polymer waveguides for electro-optical integration in data centers and high-performance computers, Opt. Express 23, 4736-4750 (2015).

International Search Report and Written Opinion of the International Searching Authority; PCT/US19/025515; Mailed Jul. 10, 2019; 15 Pages; European Patent Office.

J. Cardenas et al., "High Coupling Efficiency Etched Facet Tapers in Silicon Waveguides". IEEE Photonics Tech. Lett, vol. 26, 2380 (2014).

L. Vivien et al., "2-D taper for low loss coupling between polarization-insensitive micro-waveguides and single-mode optical fibers," IEEE J. Lightw. Technol., vol. 21, 2429 (2003).

Maegami "Spot-size converter with a SiO2 spacer layer between tapered Si and SiON waveguides for fiber-to-chip coupling".

McNab et al., "Ultra-Low Loss Photonic Integrated Circuit with Membrane-Type Photonic Crystal Waveguides", Optics Express. vol. 11, No. 22, Nov. 3, 2003, pp. 2927-2939.

Poulopoulos et al. "SiN-assisted flip-chip adiabatic coupler between SiPh and Glass OPCBs", SPIE Photonics West 2016.

Shoji et al., "Low loss mode size converter from 0.3pm square Si wire waveguides to single mode fibres", Electronics Letters, vol. 38, No. 25, Dec. 5, 202, pp. 1669-1670.

* cited by examiner

INTEGRATED CIRCUIT PACKAGES HAVING ELECTRICAL AND OPTICAL CONNECTIVITY AND METHODS OF MAKING THE SAME

CROSS-REFERENCE TO RELATED APPLICATIONS

This application is a continuation of U.S. patent application Ser. No. 17/044,707 filed on Oct. 1, 2020, which claims the benefit of priority under 35 U.S.C. § 371 of International Application No. PCT/US2019/025515, filed on Apr. 3, 2019, which claims the benefit of priority under 35 U.S.C. § 119 of U.S. Provisional Application No. 62/652,252, filed Apr. 3, 2018, the content of each of which is incorporated herein by reference in its entirety.

FIELD

The present specification relates to integrated circuit packages having glass substrates and integrated chips coupled thereto.

TECHNICAL BACKGROUND

High data transmission rates are desired for high performance computing and data center applications. Conventional optical interconnects that provide high data transmission rates may incur undesired expense due to the addition of components, may consume substantial power, and may be difficult to manufacture. Accordingly, integrated circuit packages that incorporate electrical and optical connectivity may be desired.

SUMMARY

Integrated circuit packages having electrical and optical connectivity and methods of making the same are disclosed herein.

Disclosed herein is an integrated circuit package that includes a structured glass article comprising a glass substrate, an optical channel, and redistribution layers. The integrated circuit package further includes an integrated circuit chip positioned on the glass substrate and in optical communication with the optical channel and in electrical continuity with the redistribution layers.

It is to be understood that both the foregoing general description and the following detailed description are merely exemplary and intended to provide an overview or framework to understanding the nature and character of the claimed subject matter. The accompanying drawings are included to provide a further understanding and are incorporated in and constitute a part of this specification. The drawings illustrate one or more embodiment(s), and together with the description, serve to explain principles and operation of the various embodiments.

DETAILED DESCRIPTION

Figure 1:
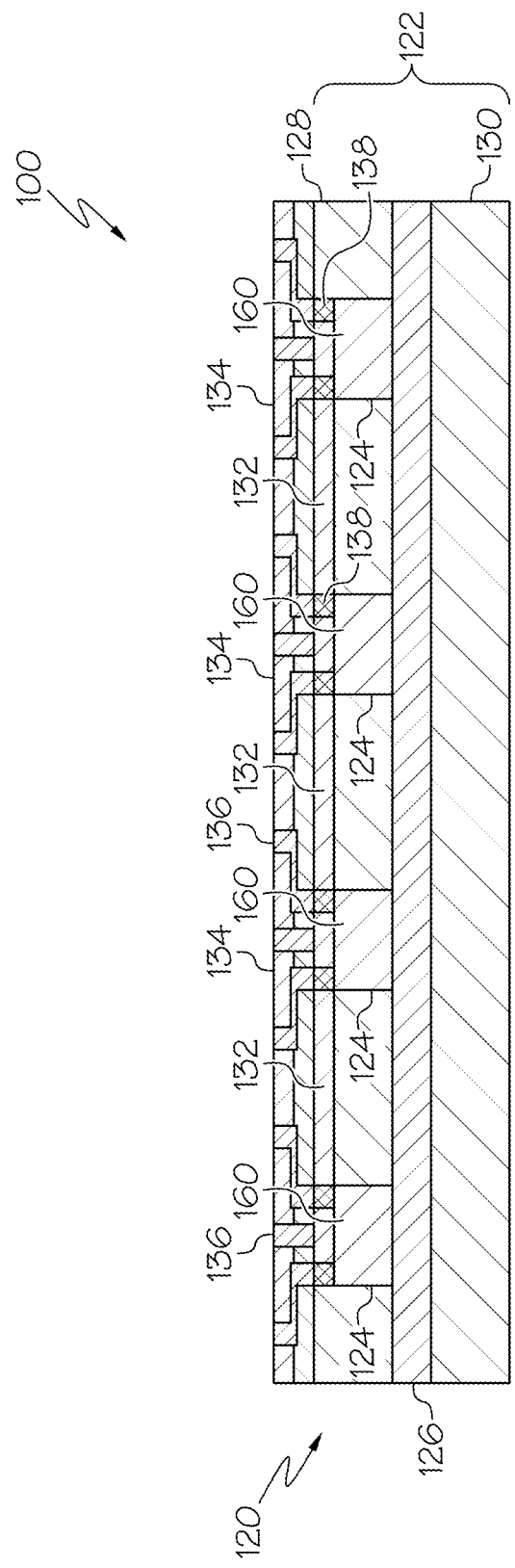
FIG. 1 is a side sectional schematic view of an integrated circuit package according to one or more embodiments shown or described herein.

Reference will now be made in detail to exemplary embodiments which are illustrated in the accompanying drawings. Whenever possible, the same reference numerals will be used throughout the drawings to refer to the same or like parts. The components in the drawings are not necessarily to scale, emphasis instead being placed upon illustrating the principles of the exemplary embodiments.

As will be discussed in greater detail below, the present disclosure is directed to integrated circuit packages having a structured glass article having a glass substrate, an optical channel, and redistribution layers. The integrated circuit package also includes an integrated circuit chip that is positioned on the glass substrate and is in optical communication with the optical channel and in electrical continuity with the redistribution layers. Embodiments of the integrated circuit packages allow for simplified assembly in which alignment of optical communication components is simplified. Further, the use of glass provides additional dimensional stability for the adjacent optical communication components as compared to conventional packaging materials. In some embodiments, the optical and electrical connections between the integrated circuit chip and the substrate are made in one operation. By separating the electrical and optical channels from one another, the data transmission rate to and from the integrated circuit chip may be improved as compared to integrated circuit chips in which the electrical and optical channels influence one another. Further, because the electrical and optical channels are connected in a single operation, assembly of the integrated circuit package may be cased, reducing the complexity and cost of manufacture.

In general, integrated circuits that incorporate integrated silicon-based photonics devices are compatible with complementary metal-oxide-semiconductor (CMOS) technology, and may be useful for high-speed chip-to-chip optical communication. Such conventional integrated circuits that include discrete photonic communication channels typically include a variety of components, such as lasers, modulators, fibers, receivers, and the like that are independently assembled and connected. At the scale of a single board, conventional optical fiber based over-the-board connectivity may provide a cost-effective solution. However, these assemblies do not scale with an increase in the number of connection.

Integrated circuit packages according to the present disclosure that incorporate integrated photonics have an advantage of high yield manufacturing, small form-factor, and low power operation as compared to integrated circuits with discrete photonic communication channels. Such integrated circuit packages may include an optical channel that includes optical waveguides that are embedded in a glass substrate. Such optical channels provide communication at scale and allow for compactness. In particular, optical interconnects between integrated circuit chips that are mounted on glass substrates having optical waveguides provide communication links that are high-density and high bit-rate over short distances that may be beneficial for high performance computing and data center applications. Such configurations of integrated circuit packages may exceed the capabilities of conventional copper-based integrated circuit packaging.

As background, integrated circuit (IC) packaging is the back-end process of semiconductor device fabrication in which the block of semiconducting material is packaged in a supporting case that provides an electrical connection from the chip density to the printed circuit board density. The case, also known as a "package," supports the electrical contacts which connect the device to a circuit board. This process is often referred to as packaging, but also can be referred to as semiconductor device assembly, encapsulation, or sealing.

As compared to conventional IC packaging, IC packaging that is incorporated onto a glass substrate, as disclosed in the present application, may tend to have greater dimensional stability than conventional organic packaging. Further, a glass substrate may have a coefficient of thermal expansion that is more closely matched to the materials of the IC itself. Accordingly, operating the IC over a variety of temperatures or manufacturing the IC and IC packaging at elevated temperatures will tend to reduce the introduction of stresses into adjoined components. Conventional organic packaging typically exhibits a high mismatch in the coefficient of thermal expansion with the materials of the IC itself.

Wafer-level packaging or wafer-level chip-scale packaging (WLP) is the technology of packaging an IC (e.g., chips or dies) while still part of the wafer, in contrast to the more conventional method of slicing the wafer into individual circuits (dicing) and then packaging them. WLP can enable integration of wafer fabrication, packaging, test, and burn-in at the wafer-level to streamline the manufacturing process undergone by a device from silicon start to customer shipment. WLP can include extending the wafer fabrication processes to include device interconnection and device protection processes. WLP involves attaching the top and bottom outer layers of packaging and the electrical bumps to ICs while still in the wafer and then dicing the wafer.

One type of WLP is fan-in (FI), which has all the contact terminals within the footprint of the die. Such a configuration can pose a limitation when adjusting the layout of the contact terminals to match the design of the next-level substrate. Fan-out (FO) is another type of WLP that represents a compromise between die-level packaging and FI WLP. FO WLP involves dicing the semiconductor wafer and then embedding the singularized ICs in a reconstituted or artificial molded wafer. The dies are separated from each other on the reconstituted wafer by a distance that is big enough to allow the desired FO redistribution layer (RDL) to be manufactured using standard WLP processes. The FO WLP provides a way to connect the smaller die with fine lead pitch to the larger lead pitch of a printed circuit board.

FIG. 1 is a cross-sectional schematic view of an integrated circuit package 100 that includes a structured glass article 120 and an integrated circuit chip 160 that is mounted to the structured glass article 120. The structured glass article 120 includes a glass substrate 122 having a cavity 124 formed therein. The integrated circuit chip 160 is positioned within the cavity 124.

The glass substrate 122 includes a glass core layer 126 coupled to a first or upper glass cladding layer 128 and a second or lower glass cladding layer 130. The glass substrate 122 includes multiple glass layers and can be considered a glass laminate. In some embodiments, the layers 126, 128, 130 are fused together without any adhesives, polymer layers, coating layers or the like positioned between them. In other embodiments, the layers 126, 128, 130 are coupled (e.g., adhered) together using adhesives or the like.

Glass substrate 122 can have any suitable composition and be made using any suitable method. Examples of suitable glass compositions can include alkaline-earth aluminoborosilicate glasses, zinc borosilicate glasses, and soda-lime glass as well as glass ceramics, such as those enriched with magnesium oxide, yttria, beryllia, alumina, or zirconia. In general, glass substrate 122 and any of the layers 126, 128, 130 in the glass substrate can have any of the compositions or be made using any of the methods disclosed in U.S. Pat. No. 9,340,451 entitled "Machining of Fusion-Drawn Glass Laminate Structures Containing a Photomachinable Layer," issued May 17, 2016, U.S. Patent Application Publication No. 2017/0073266 entitled "Glass Article and Method for Forming the Same," published Mar. 16, 2017, and U.S. Provisional Patent Application No. 62/582, 297, filed Nov. 6, 2017, and entitled "Precision Structured Glass Articles, Integrated Circuit Packages, Optical Devices, Microfluidic Devices, and Methods for Making the Same," each of which is hereby incorporated by reference in its entirety.

In some embodiments, one or both of the glass cladding layers 128, 130 are approximately 70 microns to approximately 400 microns thick or approximately 100 microns to approximately 300 microns thick. In other embodiments, one or both of the cladding layers 128, 130 are at least approximately 70 microns thick or at least approximately 100 microns thick. In other embodiments, one or both of the cladding layers 128, 130 are no more than 400 microns thick or no more than 300 microns thick. These thicknesses generally correspond to the thickness of electronic components that commonly undergo FO WLP processing. It should be appreciated, however, that the glass cladding layers 128, 130 can have other thicknesses, particularly, when used with electronic components having smaller or larger thicknesses than those disclosed.

Another aspect of the glass substrate 122 that can vary widely is the glass composition of the layers 126, 128, 130. For example, the layers 126, 128, 130 can all have the same glass composition or different glass compositions or two of the layers can have the same glass composition while the third layer has a different glass composition. In general, one or both of the glass cladding layers 128, 130 have a glass composition that is different than the glass composition of the glass core layer 126. This provides the glass cladding layers 128, 130 certain properties that make them suitable to the formation of the cavities 124.

It should be appreciated that numerous changes can be made to the embodiments of the glass substrate 122 shown in FIG. 1. For example, in some embodiments, the glass substrate 122 can include only two glass layers 128, 130. In other embodiments, the glass substrate 122 can include four or more glass layers. Numerous other variations are also contemplated.

Still referring to FIG. 1, the depicted embodiment of the integrated circuit package 100 includes a structured glass article 120 that includes a glass substrate 122 having a core layer 126, a first or upper glass cladding layer 128, and a second or lower glass cladding layer 130. The cavities 124 are introduced into the first cladding layer 128 and generally extend through the first cladding layer 128 and terminate at the core layer 126. Integrated circuit chips 160, for example, silicon-based integrated circuit chips, may be positioned within the cavities 124.

The structured glass article 120 may further include additional functional layers that are positioned above the first cladding layer 128. Such functional layers may include an optical channel 132 and dielectric layers 134. In the embodiment depicted in FIG. 1, the structured glass article further includes redistribution layers 136 that provide the integrated circuit chip 160 with electrical continuity. In various embodiments, the redistribution layers 136 may be metallic, for example, copper or copper-based. The dielectric layers 134 and the redistribution layers 136 provide electrical fan-out functionality for the integrated circuit chip 160.

The structured glass article 120 further includes optical interfaces 138 that place integrated optical transmitters and/or receivers, referred to herein as "optical ports" 162, of the integrated circuit chip 160 into optical communication with the optical channel 132 of the structured glass article 120. With the optical ports 162 of the integrated circuit chip 160 placed into optical communication with the optical channels 132 of the structured glass article 120, the integrated circuit package 100 allows for simultaneous assembly of the integrated circuit chip to the structure glass article while maintaining separation of the electrical signals from the optical communication signals.

Figure 2A:
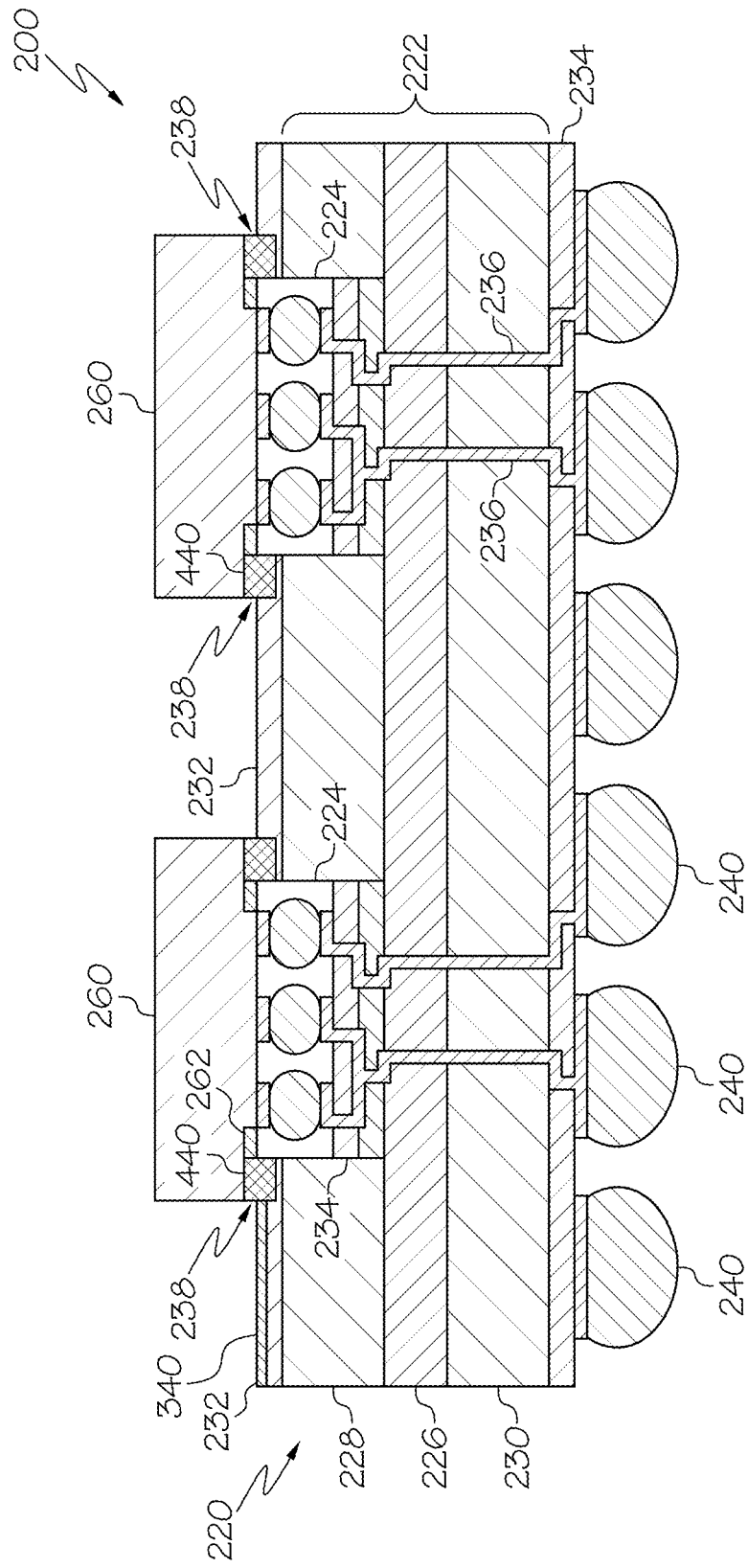
FIG. 2A is a side sectional schematic view of an integrated circuit package according to one or more embodiments shown or described herein.

Referring now to FIG. 2A, another embodiment of an integrated circuit package 200 is depicted. In the depicted embodiment, the integrated circuit package 200 includes a structured glass article 220 having a glass substrate 222. The glass substrate 222 includes a glass core layer 226 coupled to a first or upper glass cladding layer 228 and a second or lower glass cladding layer 230. The glass substrate 222 also includes cavities 224 that extend through the first glass cladding layer 228 to the glass core layer 226.

The structured glass article 220 further includes an optical channel 232 and dielectric layers 234 that are selectively positioned on the glass substrate 222. In the depicted embodiment, the dielectric layers 234 are positioned along the bottom of the cavities 224, along the surface of the glass core layer 226, and also along the opposing second glass cladding layer 230. The optical channel 232 is positioned along the first glass cladding layer 228.

Figure 2B:
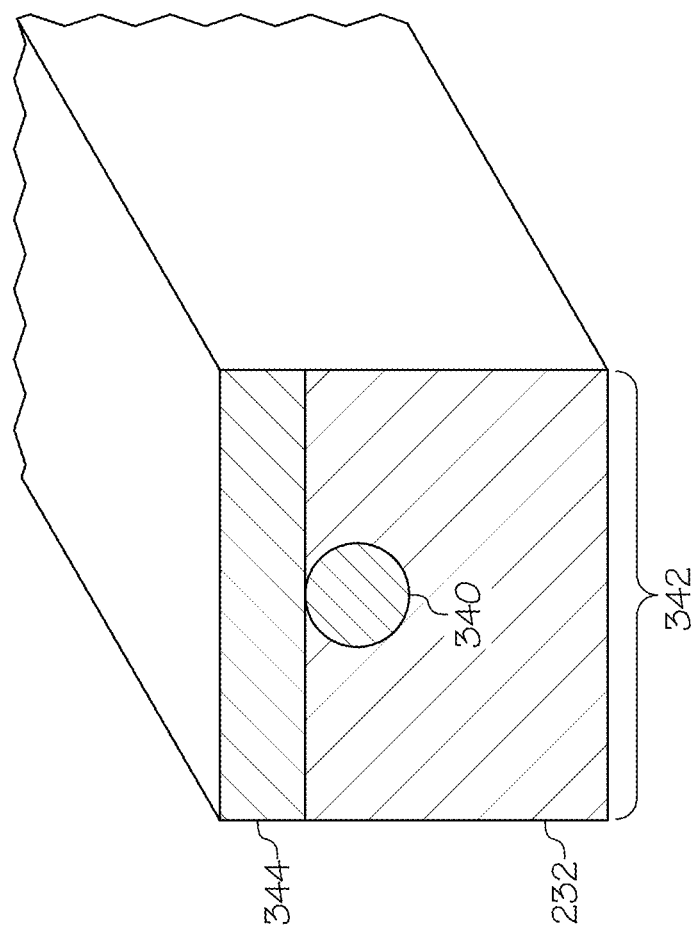
FIG. 2B is a side sectional schematic view of an optical channel of an integrated circuit package according to one or more embodiments shown or described herein.

Referring now to FIG. 2B, the optical channel 232 may include an integrated glass waveguide 340 that is embedded within the optical channel 232 itself. In various embodiments, the glass waveguide 210 may be formed integrally in the glass of the optical channel 232, such that the glass waveguide 340 has a different index of refraction than the remaining portions 342 of the optical channel 232.

The glass waveguide 340 may be formed in the surrounding optical channel 232 using a laser waveguide writing process, in which a laser introduces pulses that are tightly focused inside the bulk of the optical channel 232, and the laser pulses locally deposit energy in a small volumetric area around the laser focal point to induce local modification of the refractive index inside the optical channel 232.

Alternatively, the glass waveguide 340 may be formed in an ion-exchange process. In an ion exchange process, selected surfaces of the optical channel 232 are masked, and the masked optical channel 232 is introduced to a bath containing a salt. The materials selected for the salt bath depend on the composition of the optical channel 232. In one example, using a glass composition as described in U.S. Patent Application No. 62/582,297, the salt bath includes silver ions.

The ions in the salt bath replace ions in the glass, causing the exposed portions of the optical channel 232 to be displaced. Based on the relative size of the salt bath ions and the glass ions, the replacement ions may cause the exposed surface of the optical channel 232 to be maintained in a state of compression or tension. The modification of the stress field within the optical channel 232 forms the glass waveguide 340. The duration of the optical channel 232 being submerged and the concentration of the salt bath, among other variables, may affect the depth and intensity of the stress field that is introduced to the optical channel 232. The modified stress field of the glass waveguide 340 causes the glass in the glass waveguide 340 to exhibit a different index of refraction than the remaining optical channel 232.

In one embodiment, the ion exchange process may modify the optical channel 232 to form the glass waveguide 340 that extends from the surface of the optical channel 232 to a depth of about 20 µm, including to a depth of about 15 µm, including to a depth of about 10 µm, including to a depth of about 7.5 µm. The size of the glass waveguide 340 may be selected to generally match a lowest-order mode of an optical fiber at a predetermined wavelength of light (for example at 1310 nm wavelength). Fabricating the glass waveguide 340 with such dimensions may allow for good transmission of light from the glass waveguide 340 into an optical fiber for connection in a location remote from the integrated circuit package.

In various embodiments, the optical channel 232 may include an index matching material 344 that is coupled to the optical channel 232 at positions corresponding to the glass waveguide 340. The index matching material 344 may have an index of refraction that generally matches the index of refraction of the remaining material 342 of the optical channel 232 that has not been subjected to an index-modifying operation. The index matching material 344 may maintain the optical signal within the glass waveguide 340 of the optical channel 232.

The variation in the refractive index between the glass waveguide 340 and the remaining optical channel 232 allows the optical channel 232 to be used as an optical waveguide. Variation between the refractive indicies of the optical channel 232 and the glass waveguide 340 and of the surrounding environment limit the amount of light that escapes from the optical channel 232 in a direction transverse to the direction of introduction to the optical channel 232.

Referring again to FIG. 2A, the structured glass article 220 also includes a plurality of optical interfaces 238 that place integrated optical ports 262, of the integrated circuit chip 260 into optical communication with the optical channel 232, and in particular, the glass waveguides 340, of the structured glass article 220.

The structured glass article 220 further includes a plurality of electrical bumps 240 that provide attachment and electrical continuity between the integrated circuit chip 260 and the structured glass article 220. In one embodiment, the electrical bumps 240 may be solder balls that provide mechanical and electrical connections when melted and solidified. In another embodiment, the electrical bumps 240 may be metal deposits that allow for mechanical and electrical connection by thermocompression bonding. The structured glass article 220 also includes redistribution layers 236 that provide electrical continuity throughout the structured glass article 220. In various embodiments, redistribution layers 236 that extend through layers of the glass substrate 222 may be referred to as "vias."

In the depicted embodiment, the electrical bumps 240 are positioned between, for example, the integrated circuit chip 260 and the dielectric layer 234, and are placed into direct contact with redistribution layers 236. When the integrated circuit chip 260 is assembled with the structured glass article 220 and bonded, either through soldering or through thermocompression boding, among other techniques, the electrical bumps 240 form an electrical connection between the contacting redistribution layers 236, thereby placing the selected elements into electrical continuity with one another.

The solidified electrical bumps 240 also provide mechanical attachment of the adjoined components, and maintain the position of, for example, the integrated circuit chip 260 relative to the glass substrate 222. Maintaining the position of the integrated circuit chip 260 relative to the glass substrate 222 may be of high importance to maintain the alignment of the optical interfaces 238 that are coupled to the integrated circuit chip 260 and the optical channel 232 of the structured glass article 220. Accurate alignment of the optical interfaces 238 may ensure that optical communication signals to and from the integrated circuit chip 260 are maintained. Misalignment of the optical interfaces 238 is, in general, not well tolerated.

Figure 3:
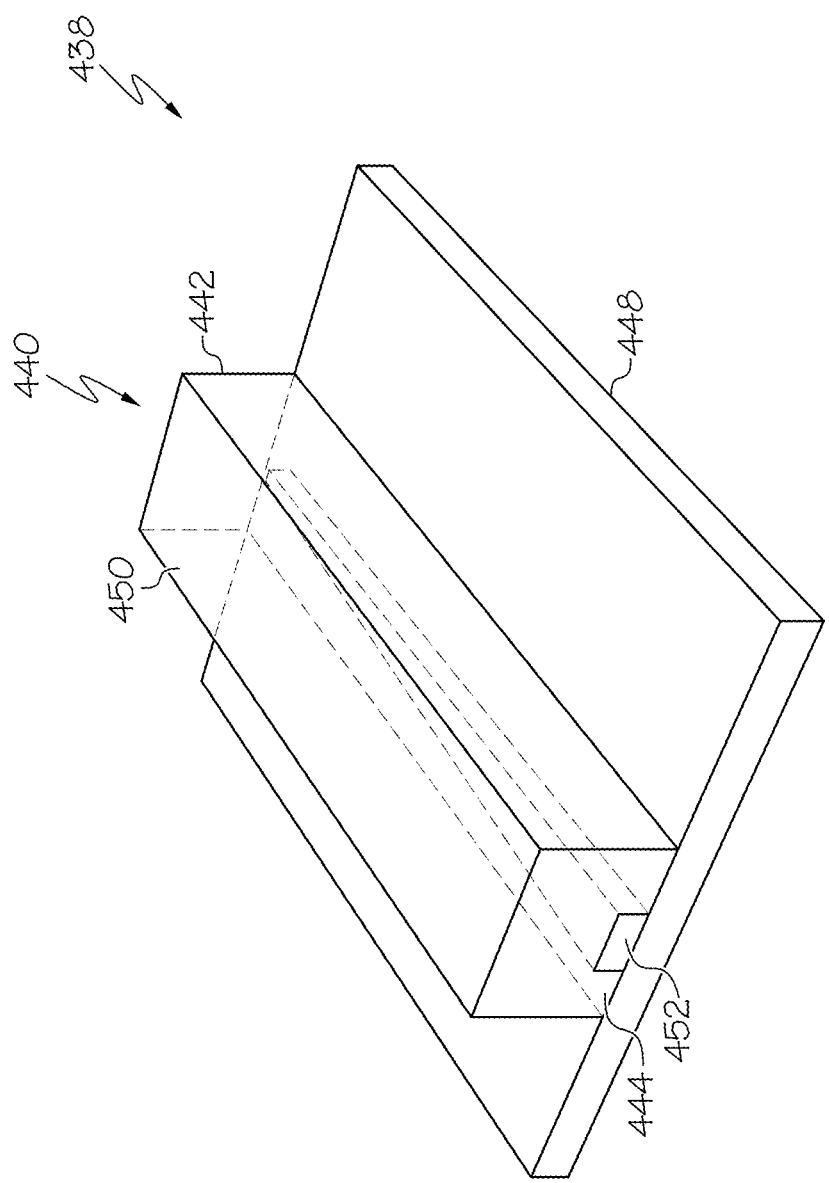
FIG. 3 is a side perspective view of an optical spot size converter according to one or more embodiments shown or described herein.

Referring now to FIG. 3, an embodiment of an optical spot size converter 440 for use in an optical interface is schematically depicted. In the depicted embodiment, the optical spot size converter 440 has an expanded optical mode portion 442 that is positioned along one end of the optical spot size converter 440 and a reduced optical mode portion 444 that is positioned along the opposite end of the optical spot size converter 440. The expanded optical mode portion 442 may be adapted to interface with an optical communication member that requires less alignment precision or that transmits a larger light beam, for example, a glass waveguide that is positioned within the optical channel, as depicted in FIGS. 1 and 2. The reduced optical mode portion 444 may be adapted to interface with an optical communication member that requires higher alignment precision or that transmits a smaller light beam, for example, an on-chip integrated light circuit waveguide that is incorporated into the an integrated circuit chip, as depicted in FIGS. 1 and 2.

The optical spot size converter 440 includes a surrounding body 450 having a generally uniform cross section that extends from the expanded optical mode portion 442 to the reduced optical mode portion 444. The surrounding body 450 also includes an interior rib 452 that is positioned within the surrounding body 450. The interior rib 452 has a cross section that varies from the expanded optical mode portion 442 to the reduced optical mode portion 444. The optical spot size converter 440 may also include a capping portion 448 that is coupled to the surrounding body 450 along a surface that generally corresponds in location to the interior rib 452. The surfaces of the optical spot size converter 440, including the surfaces in contact with the capping portion 448, may be polished to limit exiting of light from the optical spot size converter 440 in directions transverse to the direction of light transmission between the expanded optical mode portion 442 and the reduced optical mode portion 444.

The interior rib 452 exhibits a different index of refraction than the surrounding body 450. In various embodiments, the interior rib 452 and the surrounding body 450 may be made from materials having various indices of refraction. In one embodiment, the interior rib 452 may be made from silicon and is incorporated into the integrated circuit chip, while the surrounding body may be made from a glass, a polymer material, or a ceramic, such as a silicon oxynitride ($SiO_xN_y$) ceramic, including, for example, silicon dioxide ($SiO_2$) or silicon nitride ($Si_3N_4$). The materials of the interior rib 452 and the surrounding body 450 may be, in general, transmissive to the photonic energy that is transferred through the optical spot size converter 440.

The variation in the refractive index between the interior rib 452 and the remaining surrounding body 450 allows the surrounding body 450 to be used as an optical waveguide. Variation between the refractive indicies of the surrounding body 450 and the interior rib 452 and of the surrounding environment limit the amount of light energy that escapes from the surrounding body 450 in a direction transverse to the direction of introduction to the surrounding body 450.

Still referring to FIG. 3, the interior rib 452 may have a cross-section that tapers along its length, such that the interior rib 452 has a larger cross sectional area at the reduced optical mode portion 444 than at the expanded optical mode portion 442. Photons of light that are introduced to the reduced optical mode portion 444 may be directed primarily into the interior rib 452. Photons of light may induce energy into the surrounding glass body 450 by evanescence coupling, such that a substantial portion of the expanded optical mode portion 442 directs photons of light out of the optical spot size converter 440. Accordingly, the expanded optical mode portion 442 may be able to accommodate greater variation in positioning relative to communicating optical ports than the reduced optical mode portion 444.

The interior rib 452 may have a tip width that is less than about 100 nm, for example, being in a range from about 20 nm to about 80 nm, as evaluated along the expanded optical mode portion 442. In one embodiment, the interior rib 452 may taper such that the tip width of the interior rib 452 when evaluated at the reduced mode optical portion 444 is about four (4) times as thick as the tip width at when evaluated at the expanded mode optical portion 442. The relatively narrow tip width of the interior rib 452 provides superior optical coupling between the interior rib 452 and the surrounding body 450, such that light that is directed into the interior rib 452 at the reduced optical mode portion 444 may be modified to fill all or substantially all of the mode field at the expanded optical mode portion 442.

Conversely, light that is introduced to the expanded optical mode portion 442, for example, from the glass waveguide of the optical channel, may be directed into the bulk of the surrounding body 450, including, in portion, into the interior rib 452. Photons of light that enter the surrounding body 450 may induce energy into the interior rib 452 by evanescence coupling, such that a substantial portion of optical energy is directed out of the interior rib 452 at reduced optical mode portion 444. The reduced optical mode portion 444 may be used in conjunction with optical ports that are smaller in size, for example a silicon wire waveguide that is embedded in a silicon-based integrated circuit chip.

In various embodiments, the optical spot size converter 440 may be incorporated into an integrated circuit chip, and the optical spot size converter 440 may form at least a portion of an optical interface between the optical channel of the structured glass article and the integrated optical ports of the integrated circuit chip. Referring again to FIG. 2, the optical spot size converter 440 may be integrated into the integrated circuit chip 260. The optical spot size converter 440 may be installed simultaneously with the integrated circuit chip 260 onto the glass substrate 222 such that when the integrated circuit chip 260 is installed on the glass substrate 222, the optical spot size convertor 440 is accurately positioned relative to the optical channel 232. Because of the properties of the optical spot size converter 440, the optical spot size converter 440 may accommodate standard assembly tolerances that are seen in the assembly of the integrated circuit chip 260 to the glass substrate 222 while continuing to provide optical communication between the integrated optical ports of the integrated circuit chip 260 and the optical channel 232 of the structured glass article 220. Such assembly tolerances may be formed by dimensional tolerance of the structured glass article 220 itself, of the positional placement of the integrated circuit chip 260 onto the structured glass article 220, and the tolerance and flow of the electrical bumps 240.

Figure 4:
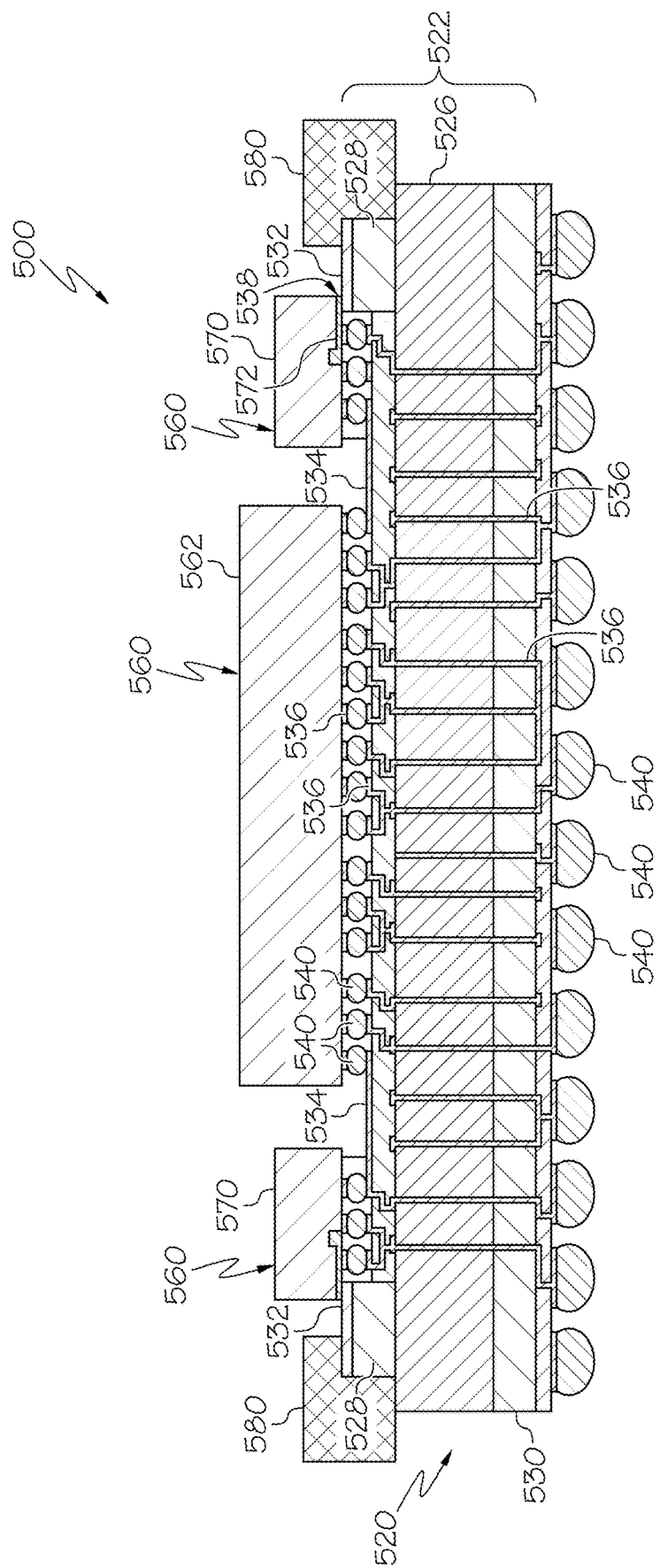
FIG. 4 is a side sectional schematic view of an integrated circuit package according to one or more embodiments shown or described herein.

Referring now to FIG. 4, another embodiment of an integrated circuit package 500 is depicted. In the depicted embodiment, the integrated circuit package 500 includes a structured glass article 520 having a glass substrate 522. The glass substrate 522 includes a glass core layer 526 coupled to a first or upper glass cladding layer 528 and a second or lower glass cladding layer 530. The glass substrate 522 also includes cavities 524 that extend through the first glass cladding layer 528 to the glass core layer 526.

The structured glass article 520 further includes an optical channel 532 and dielectric layers 534 that are selectively positioned on the glass substrate 522. In the depicted embodiment, the dielectric layers 534 are positioned along the bottom of the cavities 524, along the surface of the glass core layer 526, and also along the opposing second glass cladding layer 530. The optical channel 532 is positioned along the first glass cladding layer 528. The optical channel 532 is optically coupled to at least one optical connector 580, which may, in turn, be connected to optical cables to carry optical signals to desired locations external to the integrated circuit package 500.

The integrated circuit package 500 includes a plurality of integrated circuit chips 560, for example, an application specific integrated circuit 562 and a plurality of photonic integrated circuits 570. The application specific integrated circuit 562 and the plurality of photonic integrated circuits 570 are coupled to the glass core layer 526 though the dielectric layer 534. The structured glass article 520 also includes a plurality of optical interfaces 538 that place integrated optical ports 572 of the photonic integrated circuits 570 into optical communication with the optical channel 532 of the structured glass article 520.

The structured glass article 520 further includes a plurality of electrical bumps 540 that provide attachment and electrical continuity between the application specific integrated circuit 562 and the structured glass article 520 and between the plurality of photonic integrated circuits 570 and the structured glass article 520. The structured glass article 520 also includes redistribution layers 536 that provide electrical continuity throughout the structured glass article 520.

The electrical bumps 540 and the redistribution layers 536 place the application specific integrated circuit 562 and the plurality of photonic integrated circuits 570 into electrical continuity and into communication with one another. The integrated circuit package 500 also includes a plurality of optical interfaces 538 that place the photonic integrated circuits 570 into optical communication with the optical channel 532 of the structured glass article.

Placing the integrated optical ports in the photonic integrated circuits 570 may allow for more accurate positioning of the optical ports relative to the interfacing components of the integrated circuit package 500. In one example, the photonic integrated circuits 570 may be positioned with a high degree of accuracy relative to the optical channels 532 of the structured glass article 520. In various embodiments, the photonic integrated circuits 570 may be held in position by assembly tooling that locates the photonic integrated circuits 570 according to surfaces having known positional orientations relative to the optical ports. For example, tooling may contact the photonic integrated circuits 570 along one locating face and at two positions at faces oriented in transverse directions to the locating face. The tooling, therefore, maintains the proper location and orientation of the photonic integrated circuit 570 relative to the optical channel 532. The tooling may maintain the photonic integrated circuit 570 in such an orientation throughout melting and resolidification of the electrical bumps 540, which provide mechanical positioning of the photonic integrated circuit 570 on the structured glass article 520.

Figure 5:
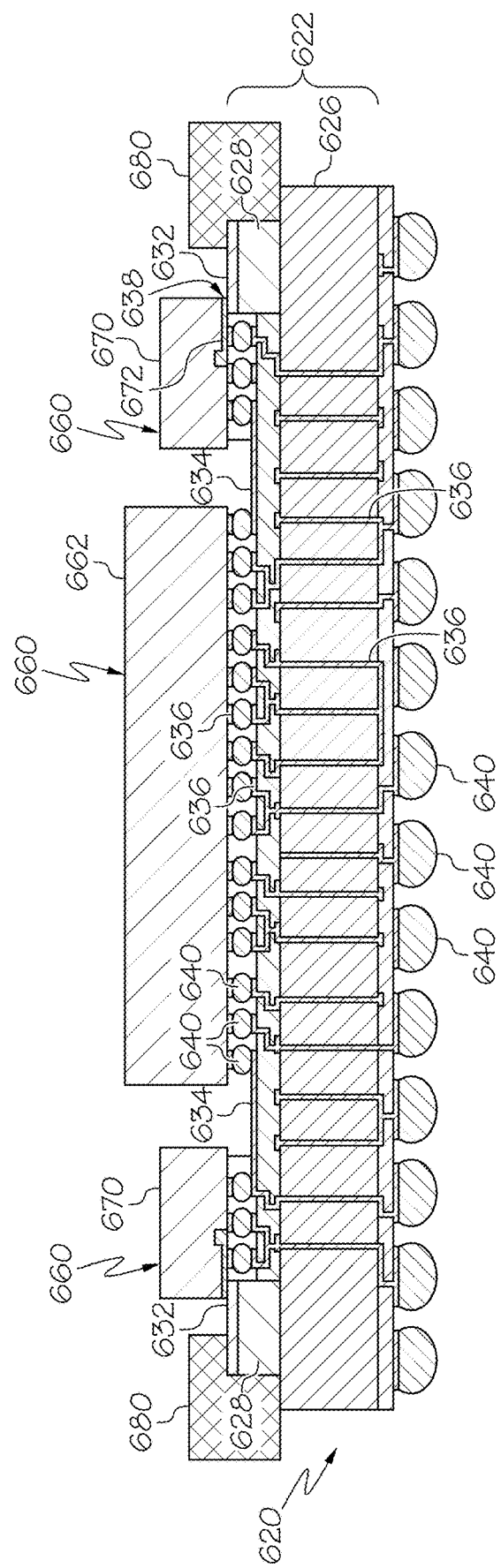
FIG. 5 is a side sectional schematic view of an integrated circuit package according to one or more embodiments shown or described herein.

Referring now to FIG. 5, another embodiment of an integrated circuit package 600 is depicted. In the depicted embodiment, the integrated circuit package 600 includes a structured glass article 620 having a glass substrate 622. The glass substrate 622 includes a glass core layer 626 coupled to a first or upper glass cladding layer 528. The glass substrate 622 is free of a second or lower glass cladding layer. The glass substrate 622 also includes cavities 624 that extend through the first glass cladding layer 628 to the glass core layer 626.

The structured glass article 620 further includes an optical channel 632 and dielectric layers 634 that are selectively positioned on the glass substrate 622. In the depicted embodiment, the dielectric layers 634 are positioned along the bottom of the cavities 624, along selected exposed surfaces of the glass core layer 626. The optical channel 632 is positioned along the first glass cladding layer 628. The optical channel 632 is optically coupled to at least one optical connector 680, which may, in turn, be connected to optical cables to carry optical signals to desired locations external to the integrated circuit package 600.

The integrated circuit package 600 includes a plurality of integrated circuit chips 660, for example, an application specific integrated circuit 662 and a plurality of photonic integrated circuits 670. The application specific integrated circuit 662 and the plurality of photonic integrated circuits 670 are coupled to the glass core layer 626 though the dielectric layer 634.

The structured glass article 620 also includes a plurality of optical interfaces 638 that place integrated optical ports 672 of the photonic integrated circuits 670 into optical communication with the optical channel 632 of the structured glass article 620.

The structured glass article 620 further includes a plurality of electrical bumps 640 that provide attachment and electrical continuity between the application specific integrated circuit 662 and the structured glass article 620 and between the plurality of photonic integrated circuits 670 and the structured glass article 620. The structured glass article 620 also includes redistribution layers 636 that provide electrical continuity throughout the structured glass article 620.

The electrical bumps 640 and the redistribution layers 636 place the application specific integrated circuit 662 and the plurality of photonic integrated circuits 670 into electrical continuity and into communication with one another. The integrated circuit package 600 also includes a plurality of optical interfaces 638 that place the photonic integrated circuits 670 into optical communication with the optical channel 632 of the structured glass article.

Figure 6:
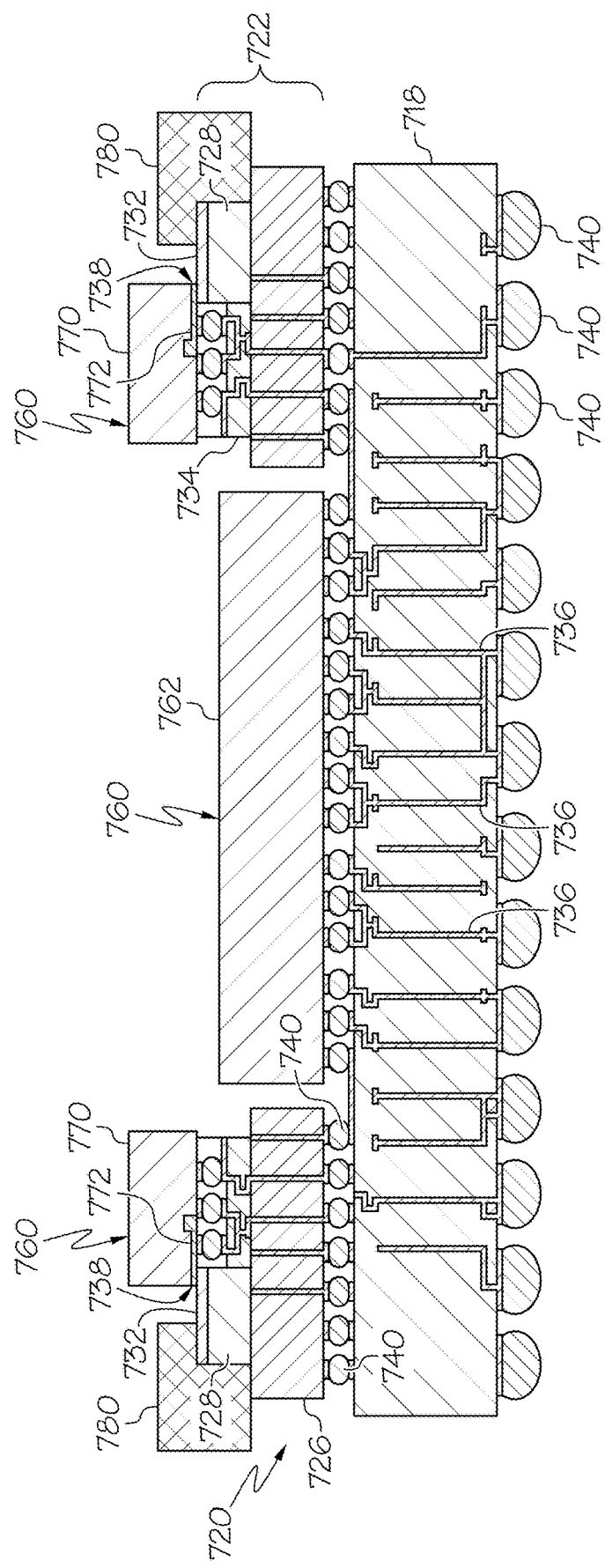
FIG. 6 is a side sectional schematic view of an integrated circuit package according to one or more embodiments shown or described herein.

Referring now to FIG. 6, another embodiment of an integrated circuit package 700 is depicted. In the depicted embodiment, the integrated circuit package 700 includes an interposer layer 718. The interposer layer 718 may be constructed from an organic material, such as a polymer, or from glass. The integrated circuit package 700 includes a plurality of structured glass articles 720 having a glass substrate 722. The glass substrate 722 includes a glass core layer 726 coupled to a first or upper glass cladding layer 728.

The structured glass articles 720 further include an optical channel 732 and dielectric layers 734 that are selectively positioned on the glass substrate 722. In the depicted embodiment, the dielectric layers 734 are positioned along selected exposed surfaces of the glass core layer 726. The optical channel 732 is positioned along the first glass cladding layer 728. The optical channel 732 is optically coupled to at least one optical connector 780, which may, in turn, be connected to optical cables to carry optical signals to desired locations external to the integrated circuit package 700.

The integrated circuit package 700 includes a plurality of integrated circuit chips 760, for example, an application specific integrated circuit 762 and a plurality of photonic integrated circuits 770. The application specific integrated circuit 762 is coupled to the interposer layer 718 by a plurality of electrical bumps 740. The plurality of photonic integrated circuits 770 are coupled to the glass core layer 726 though the dielectric layer 734. The structured glass articles 720 also include a plurality of optical interfaces 638 that place integrated optical ports 5 of the photonic integrated circuits 770 into optical communication with the optical channel 732 of the structured glass article 720.

The structured glass article 720 further includes a plurality of electrical bumps 740 that provide attachment and electrical continuity between the photonic integrated circuit 770 and the structured glass article 720. The structured glass articles 720 and the interposer layer 718 also include redistribution layers 736 that provide electrical continuity throughout the structured glass article 720 and the interposer layer 718.

The electrical bumps 740 and the redistribution layers 736 place the application specific integrated circuit 762 and the plurality of photonic integrated circuits 770 into electrical continuity and into communication with one another. The integrated circuit package 700 also includes a plurality of optical interfaces 738 that place the photonic integrated circuits 770 into optical communication with the optical channel 732 of the structured glass article.

Again, by coupling the photonic integrated circuits 770 onto structured glass articles 720, the dimensional stability of the photonic integrated circuits 770 and the optical channels 732 may be improved as compared to conventional assemblies in which comparable components are supported by organic packaging that does not provide equivalent dimensional stability as the glass.

It should now be understood that various embodiments of integrated circuit packaging that incorporates glass as a part of the packaging are envisioned. In particular, integrated circuit packages according to the present disclosure have a structured glass article having a glass substrate, an optical channel, and redistribution layers. The integrated circuit package also includes an integrated circuit chip that is positioned on the glass substrate and is in optical communication with the optical channel and in electrical continuity with the redistribution layers. Embodiments of the integrated circuit packages allow for simplified assembly in which alignment of optical communication components is simplified. Further, the use of glass provides additional dimensional stability for the adjacent optical communication components as compared to conventional packaging materials.

Terminology and Interpretative Norms

The term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

The terms "glass" and "glass composition" encompass both glass materials and glass-ceramic materials, as both classes of materials are commonly understood.

Numerical values, including endpoints of ranges, can be expressed herein as approximations preceded by the term "about," "approximately," or the like. In such cases, other embodiments include the particular numerical values. Regardless of whether a numerical value is expressed as an approximation, two embodiments are included in this disclosure: one expressed as an approximation, and another not expressed as an approximation. It will be further understood that an endpoint of each range is significant both in relation to another endpoint, and independently of another endpoint.

Directional terms as used herein—for example up, down, right, left, front, back, top, bottom, vertical, horizontal—are made only with reference to the figures as drawn and are not intended to imply absolute orientation unless otherwise expressly stated.

Unless otherwise expressly stated, it is in no way intended that any method set forth herein be construed as requiring that its steps be performed in a specific order, nor that with any apparatus specific orientations be required. Accordingly, where a method claim does not actually recite an order to be followed by its steps, or that any apparatus claim does not actually recite an order or orientation to individual components, or it is not otherwise specifically stated in the claims or description that the steps are to be limited to a specific order, or that a specific order or orientation to components of an apparatus is not recited, it is in no way intended that an order or orientation be inferred, in any respect. This holds for any possible non-express basis for interpretation, including: matters of logic with respect to arrangement of steps, operational flow, order of components, or orientation of components; plain meaning derived from grammatical organization or punctuation, and; the number or type of embodiments described in the specification.

As used herein, the singular forms "a," "an" and "the" include plural referents unless the context clearly dictates otherwise. Thus, for example, reference to "a" component includes aspects having two or more such components, unless the context clearly indicates otherwise. Also, the word "or" when used without a preceding "either" (or other similar language indicating that "or" is unequivocally meant to be exclusive—e.g., only one of x or y, etc.) shall be interpreted to be inclusive (e.g., "x or y" means one or both x or y).

The term "and/or" shall also be interpreted to be inclusive (e.g., "x and/or y" means one or both x or y). In situations where "and/or" or "or" are used as a conjunction for a group of three or more items, the group should be interpreted to include one item alone, all the items together, or any combination or number of the items. Moreover, terms used in the specification and claims such as have, having, include, and including should be construed to be synonymous with the terms comprise and comprising.

Unless otherwise indicated, all numbers or expressions, such as those expressing dimensions, physical characteristics, and the like, used in the specification (other than the claims) are understood to be modified in all instances by the term "approximately." At the very least, and not as an attempt to limit the application of the doctrine of equivalents to the claims, each numerical parameter recited in the specification or claims which is modified by the term "approximately" should be construed in light of the number of recited significant digits and by applying ordinary rounding techniques.

All disclosed ranges are to be understood to encompass and provide support for claims that recite any and all subranges or any and all individual values subsumed by each range. For example, a stated range of 1 to 10 should be considered to include and provide support for claims that recite any and all subranges or individual values that are between and/or inclusive of the minimum value of 1 and the maximum value of 10; that is, all subranges beginning with a minimum value of 1 or more and ending with a maximum value of 10 or less (e.g., 5.5 to 10, 2.34 to 3.56, and so forth) or any values from 1 to 10 (e.g., 3, 5.8, 9.9994, and so forth).

All disclosed numerical values are to be understood as being variable from 0-100% in either direction and thus provide support for claims that recite such values or any and all ranges or subranges that can be formed by such values. For example, a stated numerical value of 8 should be understood to vary from 0 to 16 (100% in either direction) and provide support for claims that recite the range itself (e.g., 0 to 16), any subrange within the range (e.g., 2 to 12.5) or any individual value within that range (e.g., 15.2).

The drawings shall be interpreted as illustrating one or more embodiments that are drawn to scale and/or one or more embodiments that are not drawn to scale. This means the drawings can be interpreted, for example, as showing: (a) everything drawn to scale, (b) nothing drawn to scale, or (c) one or more features drawn to scale and one or more features not drawn to scale. Accordingly, the drawings can serve to provide support to recite the sizes, proportions, and/or other dimensions of any of the illustrated features either alone or relative to each other. Furthermore, all such sizes, proportions, and/or other dimensions are to be understood as being variable from 0-100% in either direction and thus provide support for claims that recite such values or any and all ranges or subranges that can be formed by such values.

The terms recited in the claims should be given their ordinary and customary meaning as determined by reference to relevant entries in widely used general dictionaries and/or relevant technical dictionaries, commonly understood meanings by those in the art, etc., with the understanding that the broadest meaning imparted by any one or combination of these sources should be given to the claim terms (e.g., two or more relevant dictionary entries should be combined to provide the broadest meaning of the combination of entries, etc.) subject only to the following exceptions: (a) if a term is used in a manner that is more expansive than its ordinary and customary meaning, the term should be given its ordinary and customary meaning plus the additional expansive meaning, or (b) if a term has been explicitly defined to have a different meaning by reciting the term followed by the phrase "as used in this document shall mean" or similar language (e.g., "this term means," "this term is defined as," "for the purposes of this disclosure this term shall mean," etc.). References to specific examples, use of "i.e.," use of the word "invention," etc., are not meant to invoke exception (b) or otherwise restrict the scope of the recited claim terms. Other than situations where exception (b) applies, nothing contained in this document should be considered a disclaimer or disavowal of claim scope.

The subject matter recited in the claims is not coextensive with and should not be interpreted to be coextensive with any embodiment, feature, or combination of features described or illustrated in this document. This is true even if only a single embodiment of the feature or combination of features is illustrated and described in this document.

It will be apparent to those skilled in the art that various modifications and variations can be made without departing from the spirit or scope of the claimed subject matter. Accordingly, the claimed subject matter is not to be restricted except in light of the attached claims and their equivalents.

The invention claimed is:

1. An integrated circuit package, comprising:
a glass substrate comprising a glass core layer, a glass cladding layer fused to the glass core layer, and one or more cavities formed in the glass substrate;
an integrated circuit chip positioned in the one or more cavities;
an optical channel in optical communication with the integrated circuit chip; and
redistribution layers in electrical continuity with the integrated circuit chip.

2. The integrated circuit package of claim 1, wherein the integrated circuit chip is positioned over the one or more cavities.

3. The integrated circuit package of claim 1, wherein the one or more cavities are formed in the glass cladding layer such that the glass cladding layer defines sidewalls of the one or more cavities.

4. The integrated circuit package of claim 1, wherein the glass cladding layer comprises the optical channel.

5. The integrated circuit package of claim 1, wherein the optical channel comprises a glass waveguide embedded in the optical channel.

6. The integrated circuit package of claim 5, wherein the glass waveguide defines a first portion of the optical channel and comprises a glass material having an index of refraction that differs from a remaining portion of the optical channel.

7. The integrated circuit package of claim 5, wherein the glass waveguide exhibits internal compression.

8. The integrated circuit package of claim 6, wherein the glass waveguide is formed in the optical channel by a laser-writing process.

9. The integrated circuit package of claim 6, wherein the glass waveguide is formed in the optical channel by an ion-exchange process.

10. The integrated circuit package of claim 6, wherein the glass waveguide and the remaining portion of the optical channel comprise the same composition.

11. The integrated circuit package of claim 5, further comprising an optical interface that places optical ports into optical communication with the optical waveguide.

12. The integrated circuit package of claim 11, wherein the optical interface comprises an optical spot size converter comprising a surrounding body having a first index of refraction and an interior rib positioned inside the surrounding body and having a second index of refraction that differs from the first index of refraction.

13. The integrated circuit package of claim 1, further comprising dielectric layers coupled to the glass substrate.

14. The integrated circuit package of claim 1, wherein the integrated circuit chip comprises a photonic integrated circuit comprising optical ports.

15. The integrated circuit package of claim 14, further comprising an application specific integrated circuit in electrical continuity with the redistribution layers and optically isolated from the optical channel.

16. The integrated circuit package of claim 1, further comprising an optical connector in optical communication with the optical channel.

17. The integrated circuit package of claim 12, wherein the optical spot size converter comprises an expanded optical mode portion positioned along a first end of the optical spot size converter and a reduced optical mode portion positioned along a second end of the optical spot size converter opposite the first end.

18. A method of making an integrated circuit package comprising:
positioning an integrated circuit chip in a cavity of a glass substrate comprising a glass core layer and a glass cladding layer fused to the glass core layer;
maintaining the integrated circuit chip such that integrated optical ports are aligned with an optical channel coupled to the glass substrate; and
bonding the integrated circuit chip to the glass substrate;
wherein the integrated circuit chip is in optical communication with the optical channel and in electrical continuity with a redistribution layer of the integrated circuit package.

19. The method of claim 18, wherein the redistribution layer is incorporated onto the glass substrate and the bonding places the integrated circuit chip in electrical continuity with the redistribution layer.

20. The method of claim 18, wherein the bonding maintains alignment between the optical ports and the optical channel of the glass substrate.

21. An integrated circuit package, comprising:
a glass substrate comprising a glass core layer, a glass cladding layer fused to the glass core layer, and one or more cavities formed in the glass substrate;
an integrated circuit chip positioned at least partially in or over the one or more cavities;
an optical channel in optical communication with the integrated circuit chip, the optical channel comprising a glass waveguide embedded therein;
an optical interface that places optical ports into optical communication with the optical waveguide, the optical interface comprising an optical spot size converter comprising a surrounding body comprising a first index of refraction and an interior rib comprising a second index of refraction that differs from the first index of refraction positioned inside the surrounding body; and
redistribution layers in electrical continuity with the integrated circuit chip.

22. The integrated circuit package of claim 21, wherein the optical spot size converter comprises an expanded optical mode portion positioned along a first end of the optical spot size converter and a reduced optical mode portion positioned along a second end of the optical spot size converter opposite the first end.

* * * * *